(12) United States Patent
Naffziger et al.

(10) Patent No.: US 7,199,611 B2
(45) Date of Patent: *Apr. 3, 2007

(54) SYSTEM TO TEMPORARILY MODIFY AN OUTPUT WAVEFORM

(75) Inventors: Samuel D. Naffziger, Fort Collins, CO (US); Eric S. Fetzer, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 10 days.

This patent is subject to a terminal disclaimer.

(21) Appl. No.: 10/646,936

(22) Filed: Aug. 22, 2003

(65) Prior Publication Data
US 2005/0040870 A1 Feb. 24, 2005

(51) Int. Cl.
*H01L 7/085* (2006.01)
(52) U.S. Cl. .................... 326/59; 326/98; 327/126; 327/333; 178/68
(58) Field of Classification Search ................. 326/59, 326/98; 327/126, 333; 178/68; 246/167 R; 330/10
See application file for complete search history.

(56) References Cited

U.S. PATENT DOCUMENTS

| | | | | |
|---|---|---|---|---|
| 4,170,715 A * | 10/1979 | Mizokawa | ................... | 178/68 |
| 4,303,945 A * | 12/1981 | Fawcett et al. | ........ | 348/208.14 |
| 5,181,133 A * | 1/1993 | Lipton | ......................... | 349/15 |
| 5,296,756 A * | 3/1994 | Patel et al. | ................... | 326/21 |
| 5,507,456 A * | 4/1996 | Brown et al. | ........... | 246/167 R |
| 5,550,487 A | 8/1996 | Lyon | | |
| 5,949,723 A | 9/1999 | Clemen et al. | | |
| 6,075,386 A | 6/2000 | Naffziger | | |
| 6,097,207 A | 8/2000 | Bernstein et al. | | |
| 6,127,858 A | 10/2000 | Stinson et al. | | |
| 6,281,710 B1 | 8/2001 | Poirier et al. | | |
| 6,339,835 B1 | 1/2002 | Reddy et al. | | |
| 6,518,796 B1 | 2/2003 | Stan et al. | | |
| 6,529,045 B2 | 3/2003 | Ye et al. | | |
| 6,781,416 B1 * | 8/2004 | Nguyen et al. | ................ | 326/83 |
| 6,830,550 B2 * | 12/2004 | Hedgecock | .................. | 600/554 |

OTHER PUBLICATIONS

American Hertage Dictionary of the English Language from Xreferplus reciting the basic definition of diode.*
Horn TAB books Basic Electronics Theory fourth edition 1994 pp. 377-328.*

* cited by examiner

*Primary Examiner*—Michael B Shingleton

(57) ABSTRACT

Systems and methods are disclosed for providing a temporarily modified output. A waveform control provides a control output that temporarily adjusts to an intermediate level between normal high and low levels during a first operating mode. The waveform control provides the control output to transition periodically between the high and low levels during a second operating mode. A delay network controls the waveform control to provide the output at the intermediate level for a duration during the first operating mode.

24 Claims, 7 Drawing Sheets

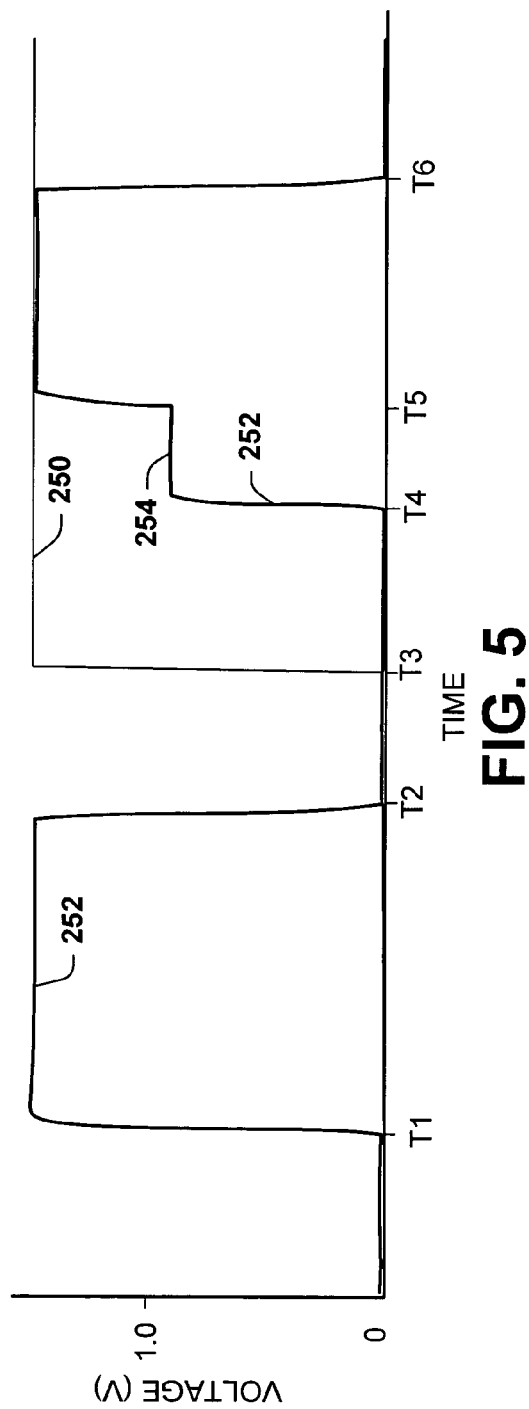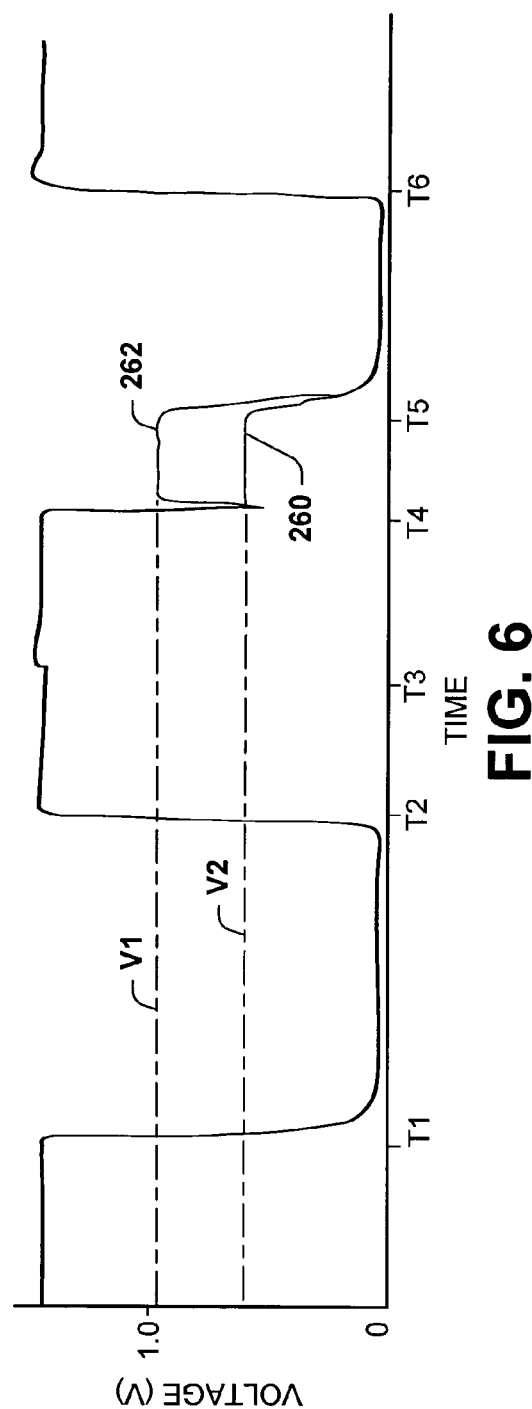

SYSTEM TO TEMPORARILY MODIFY AN OUTPUT WAVEFORM

RELATED APPLICATION

This application is related to co-pending and commonly assigned U.S. patent application to S. Naffziger, which was filed contemporaneously with this application and entitled METHOD AND SYSTEM TO TEMPORARILY MODIFY AN OUTPUT WAVEFORM, U.S. patent application Ser. No. 0/646,935, the disclosure of which is incorporated herein by reference.

TECHNICAL FIELD

The present invention relates to electrical circuits and, more particularly, to a system to temporarily modify an output.

BACKGROUND OF INVENTION

In the manufacturing of various types of integrated circuits (ICs), a process referred to as burn-in is employed to reduce failures due to infant mortality. Burn-in accelerates defects by operating the circuitry under extreme operating conditions for a period of time. The time period and conditions (input power cycling, load switching, temperature, etc.) generally vary according to manufacturer and the type of IC.

For very large scale integration (VLSI) designs, operating conditions for burn-in generally include a much higher voltage and temperature than during normal operation for the device. The burn-in test process thus exposes a potential defect in the chip by operating the circuitry under such extreme conditions. For instance, a processor that normally operates at 1.5 V and at a maximum temperature of 110 degrees C., such as when used in a computer, might be burned in at 2.1 V and 120 degrees C. These elevated operating conditions accelerate failures due to latent, but not catastrophic manufacturing defects.

In order for burn-in to effectively accelerate the occurrence of these latent defects, however, the device must be operating correctly so that a very high percentage of the circuitry is activated. Accordingly, the burn-in operating conditions maintain substantially all parts of the chip active and then appropriate testcases are run on the chip to validate the functionality under the increased stress operating conditions associated with burn-in. Ensuring proper operation of the chip during burn-in can become difficult for certain types of circuitry, and further increases as greater device densities are implemented for ICs.

Domino gates are an example of one type of circuitry that tends to operate deficiently during burn-in conditions. Briefly stated, a domino gate is a high-performance circuit that facilitates evaluation of an associated logic function by cycling between a precharge state and an evaluation state. Domino gates can fail in the absence of taking explicit steps to protect such circuitry during burn-in. Thus, to help these and other types of circuits operate correctly, supplemental circuitry, such as a keeper circuit, has been developed. A keeper circuits operates to prevent a node or bit from losing its charge, for example, by supplying a voltage at such node. Some types of keeper circuits can impose penalties since large areas may be needed to implement such circuitry, or the operation of the gate can be slowed. Additionally or alternatively, existing keeper circuits may require use of an external signal to implement keeper functions at appropriate times. The extra overhead associated with these and other keeper solutions can further result in decreased performance during normal operation.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some general concepts of the invention in a simplified form as a prelude to the more detailed description that is presented later.

One embodiment of the present invention relates generally to a system for providing a temporarily modified output. A waveform control provides a control output that temporarily adjusts to an intermediate level between normal high and low levels during a first operating mode. The waveform control provides the control output to transition periodically between the high and low levels during a second operating mode. A delay network controls the waveform control to provide the output at the intermediate level for a duration during the first operating mode.

Another embodiment of the present invention relates generally to a clock generator. The clock generator includes a driver that provides an output clock signal based on at least one control signal. A waveform controller provides the at least one control signal having a first waveform characteristic during a first operating mode to control the driver to provide the output clock signal having normally high and low levels. The waveform controller provides the at least one control signal having a second waveform characteristic during a second operating mode to control the driver to temporarily provide the output signal at an intermediate level between the normally high and low levels.

Another embodiment of the present invention relates to a method for temporarily modifying an output signal. The method includes providing a control signal that transitions between the normally high and low levels during a normal operating mode. The control signal is temporarily adjusted to an intermediate level between the normally high and low levels during a second operating mode. One of the normal operating mode and the second operating mode is selected to control waveform characteristics of the control signal based on the selected operating mode.

BRIEF DESCRIPTION OF THE DRAWINGS

FIG. 5 is a graph depicting sample waveforms for various signals in the example circuit of FIG. 4 in accordance with an embodiment of the present invention.

FIG. 6 is a graph depicting sample waveforms for various signals in the example circuit of FIG. 4 in accordance with an embodiment of the present invention.

DETAILED DESCRIPTION

The present invention relates generally to a system to temporarily modify an output signal (e.g., a clock output signal provided by a clock generator in an integrated circuit) based on an operating mode of the system. The system can include a first operating mode (e.g., a normal mode) in which the output signal transitions between normally high and low levels. The output signal is temporarily modified during a second operating mode (e.g., burn-in or other noise-inducing operating mode). For example, a waveform control (e.g., implemented as part of a clock gater) controls an associated driver to generate the output signal at an intermediate level that is between its normally high and low levels during the second operating mode. Such operation mitigates noise that may occur in the second operating mode. After providing the output signal at the intermediate level for a desired duration, the waveform control can cause the driver to provide the output signal at one of its corresponding high or low levels.

The intermediate level of the output signal can be implemented, for example, during a high stress condition (e.g., a burn-in process) to facilitate evaluation of associated circuitry. The associated circuitry can include a precharge device coupled to receive the output signal. The precharge device can operate as a supplemental keeper according to the output signal provided at the intermediate level during burn-in. By mitigating the effects of leakage during burn-in conditions, noise immunity can increase to facilitate evaluation of the associated circuitry. Such an arrangement can also enable the associated circuitry driven by the output signal to utilize smaller keepers than many conventional approaches.

Figure 1:
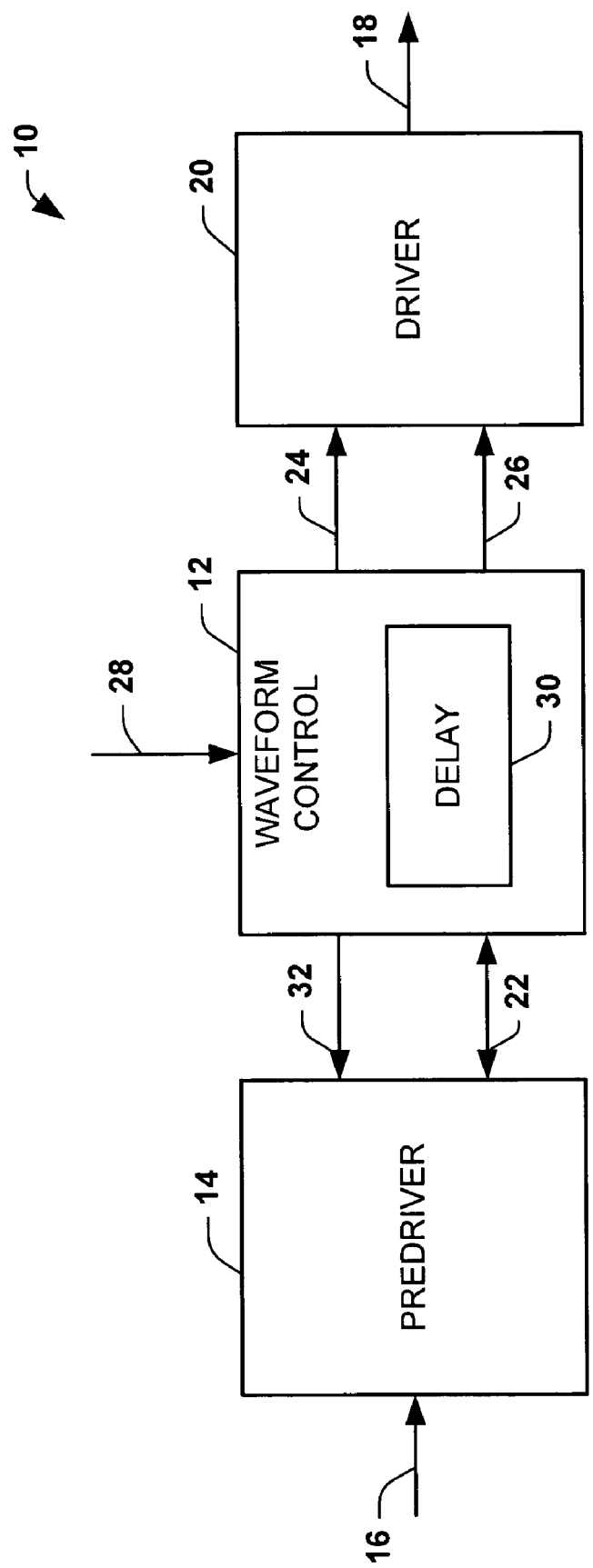
FIG. 1 depicts a block diagram of a clock generation system that can be implemented in accordance with an embodiment of the present invention.

FIG. 1 illustrates a clock generation system 10 that includes a waveform control block 12 implemented in accordance with an aspect of the present invention. As with typical clock generators, the system 10 includes a predriver 14 that receives one or more input signals 16. An associated driver 20 provides a clock output signal 18 based on the input signals 16. The waveform control block 12 is operatively associated with the predriver 14 and driver 20. In the example of FIG. 1, the waveform control block 12 is interconnected between the predriver 14 and the driver 20. The clock generation system 10, for example, corresponds to a clock gater which forms an active buffer network that controls biasing components in the associated driver 20 in a desired manner. Those skilled in the art will understand and appreciate that such an approach enables the waveform control block 12 to be implemented as a modular extension of most existing clock generators (or clock gaters) according to an aspect of the present invention.

The predriver 14 provides one or more signals 22 to the waveform control block 12. During normal operating conditions, the waveform control block 12 provides output signals 24 and 26 to the driver 20. These signals 24 and 26 correspond to waveforms having characteristics designed to generate the output signal 18 as a clock signal for driving associated circuitry (not shown). The predriver output signal 22, for example, includes a clock signal as well as possibly one or more other signals that can be utilized in the respective generation of output signals 24 and 26. Typically, the signals 22, 24 and 28 correspond to logic levels (e.g., high or low), which can be controlled by associated blocks of the system 10.

The waveform control block 12 also receives an enable signal 28, which enables operation of the system in a noise reduction mode that is operative increase robustness of associated circuitry (not shown). The noise reduction mode, for example, can be implemented during a burn-in process such as is utilized to force early failure of latent defects in associated circuitry (not shown). It is to be appreciated that the noise reduction mode can be implemented in other circumstances in which it may be desirable to mitigate noise in associated circuitry being driven by the system 10.

During the noise reduction mode, the waveform control block 12 modifies one or both of the output signals 24 and 26 based on the enable signal 28 to have a waveform characteristic that is different from such signals during the normal operating mode. The modified output signals 24 and 26 control the driver 20 to provide the output signal 18 at a temporary intermediate level. For example, the driver 20 provides the signal 18 as a clock signal that periodically transitions between normally high and low levels. In response to the enable signal 28, the waveform control block 12 can provide one or both of the signals 24 and 26 to the driver 20 to have a modified waveform (e.g., at reduced levels) so that the output signal 18 remains at an intermediate level between the high and low levels for a duration. The duration for which the output signal is provided can depend, for example, on the enable signal 28 and the one or more signals 22 provided by the predriver 14. The intermediate level can vary according to the configuration and relative values of the driver components, including component differences associated with process variations.

The waveform control block 12 includes an associated delay block 30 that is operative to control the duration for which the output signal is maintained at the intermediate level. For example, the delay block 30 operates in response to the control input signal 28 so that one or both of the signals 24 and 26 provided to the driver 20 is modified for the predetermined duration. The modified signals 24 and/or 26 control the driver 20 to provide the output signal at the intermediate level according to the duration. After the duration, the delay block 30 causes the waveform control block 12 to provide the output signals 24 and 26 in their normal states. In example implementation, the waveform control block 12 can provide a feedback signal 32 to the predriver 14 indicative of the delay being implemented by the delay block 30. The predriver 14 thus can provide the one or more signals 22 to cause the waveform control block 12 to control the driver 20 in a normal mode, such that the output signal 18 returns to one of its normal high or low levels.

According to one aspect of the present invention, the waveform control block 12 provides the signals 24 and 26 during a burn-in condition to implement a circuit that produces the output signal 18 at the intermediate level for the desired duration. By way of further example, the signals 24 and 26 can correspond to control inputs for respective transistor devices. The waveform control block 12 includes other circuitry that cooperates with the transistor devices of the driver 20 during burn-in to enable the driver 20 to provide the output signal 18 at the intermediate level. Those skilled in the art will understand and appreciate various circuit arrangements that can be implemented to provide the functionality of the waveform control block 12 and driver 20.

In one implementation, the intermediate level of the output signal 18 can be self-biasing, such as biasing to a level according to the particular components that form the driver 20. Accordingly, local process variations in the driver components will be reflected in the output signal 18 generated by the driver 20. Because the driver 20 and the circuitry being driven by the driver are usually in close proximity to each other on an IC chip, the output signal at 18 also is provided at a level that reflects the process variations in such associated circuitry. As a result, the effects of local process variations in can be mitigated by a system that modifies an output signal according to an aspect of the present invention. This further facilitates evaluation of he such circuitry during bum-in.

For example, where the system 10 and associated circuitry are implemented in an IC fabricated using a BiCMOS (Bipolar Complimentary Metal Oxide Semiconductor) process, for example, local process variations in the relative strength of PMOS and NMOS devices may exist. The waveform control block 12 provides the signals 24 and 26 to control the driver 20 to provide the output signal 18 at an intermediate level based on the relative strength of NMOS and PMOS devices in the driver. The driver output signal 18 at the intermediate level thus can mitigate the effects of process variations in the associated circuitry during a bum-in process since similar process variations exist in the driver and in the associated circuitry.

Figure 2:
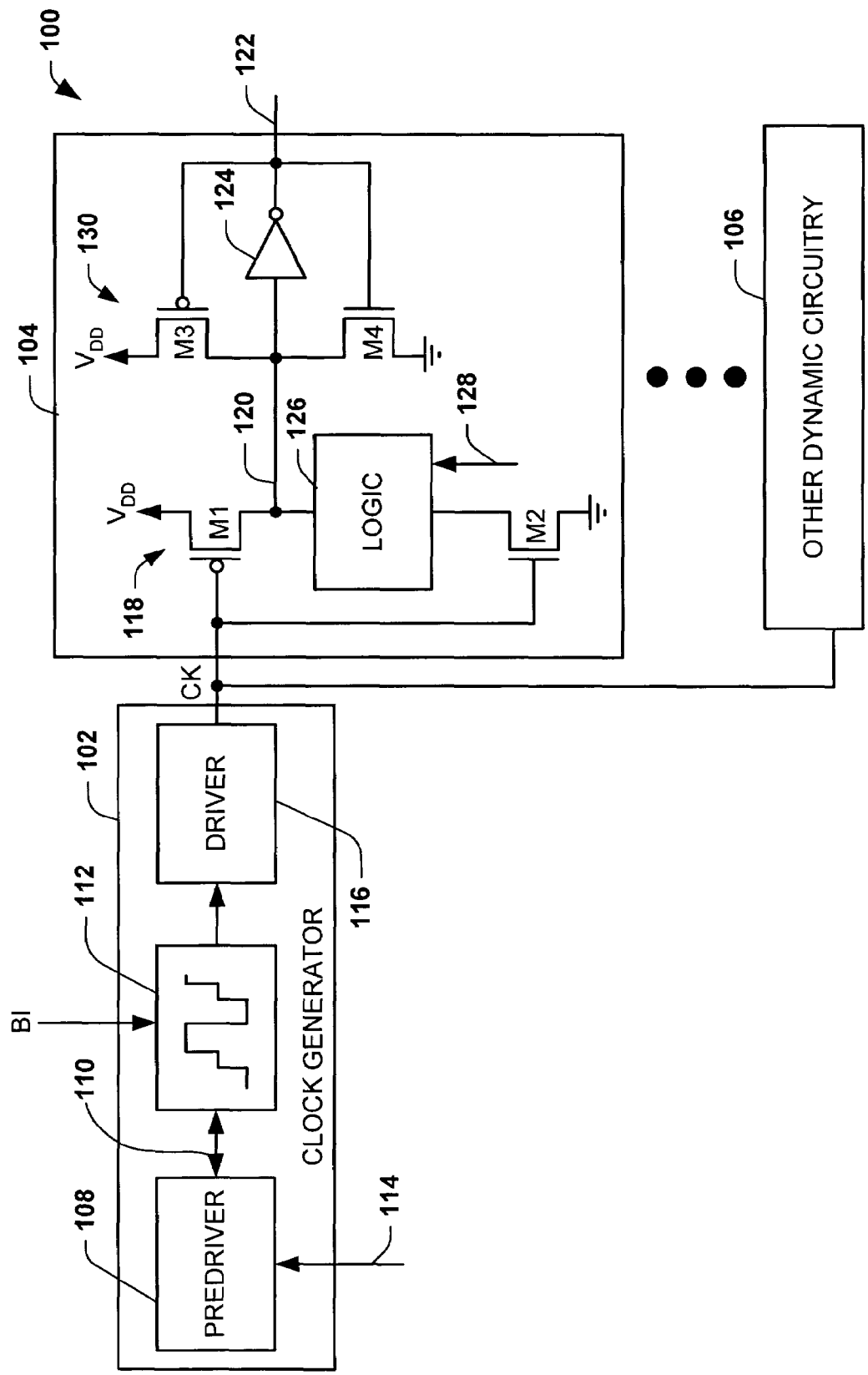
FIG. 2 depicts a clock generation system for controlling plural dynamic circuits according to an embodiment of the present invention.

FIG. 2 illustrates an example of part of an integrated circuit (IC) 100 that includes a clock generator system (or clock gater) 102 implemented in accordance with an aspect of the present invention. The clock generator 102 is coupled to control associated circuitry, such as a plurality of dynamic circuits, indicated at 104 and 106. The clock generator 102 controls dynamic circuits 104–106 with one or more clock signals, indicated at CK. The clock signal CK, for example, gates one or more associated precharge devices of the respective circuits 104–106 to facilitate evaluating state information (e.g., logic state) of such circuitry. It is will be appreciated that there can be any number of one or more associated circuitry 104–106, as indicated by the ellipsis. For example, there typically are hundreds or thousands of such circuits associated with a clock generator in a typical VLSI design (e.g., a microprocessor).

The clock generator 102 includes a predriver 108 that provides one or more internal signals 110 to an associated control system 112 as a function of one or more predriver input signals 114. The one or more signals 110 can also include feed back information from the control system 112. For example, the input signal 114 is an oscillator input signal provided (e.g., by an oscillator) to control the frequency of the clock signal CK provided by the clock generator 102. The control system 112 also receives an enable input signal, indicated at BI, that is utilized to operate the clock generator 102 in noise reduction mode, such as during a bum-in process. The bum-in process operates the associated circuits 104–106 under high stress conditions, for example, at a higher voltage and a higher temperature than normal operating conditions. Additionally, bum-in usually is implemented at a lower frequency than normal operating frequencies. The control system 112 provides one or more corresponding output control signals to a driver 116 that is coupled to the associated circuits 104–106. The driver 116 provides the corresponding clock signal CK based on the signal(s) from the control system 112.

In a normal operating mode, the driver 116 provides the clock signal CK to alternate between high and low levels at a desired clock frequency. During a noise reduction mode (e.g., bum-in), the control system 112 controls the driver 116 to provide the clock signal CK to the circuits 104–106 so as to have an intermediate (e.g., a shelf) level between the normal high and low levels for a predetermined first duration. After having the intermediate level for the first duration, the clock signal transitions to one of the high or low clock level for a subsequent duration. As a result, the bum-in process is facilitated according to an aspect of the present invention. Further, by employing the intermediate level during bum-in, the associated circuitry 104–106 are controlled so as to improve noise immunity and mitigate leakage in such circuits. The intermediate level of the clock signal CK generated by the driver 116 during the bum-in condition can be variable or fixed. Additionally or alternatively, the duration at the intermediate level can be fixed or variable, such as based on a delay implemented by the control system 112.

According to one aspect of the present invention, the intermediate level of the clock signal CK during in the noise-reduction mode is self-biasing (e.g., tuned) according to the relative strengths of the components comprising the driver 116. The relative strengths of such components, for example, depend on process variations associated with fabrication of the IC 100. Such process variations tend to be localized and thus can vary across the IC 100. Because the level of the clock signal CK is tuned to an intermediate level that reflects process variations in the driver 116 and since at least a substantial portion of the associated circuitry 104–106 is located proximal to the driver, the clock signal drives the associated circuitry at a level that mitigates the effects of corresponding process variations in such circuitry.

In the example of FIG. 2, the associated circuit 104 is implemented as a domino logic circuit. Those skilled in the art will understand and appreciate various configurations of domino circuits that can be utilized in this or the other dynamic circuitry 106. As mentioned above, typically hundreds or thousands of such circuits 104–106 are driven by a given clock generator. For purposes of simplification of illustration, only the contents of 104 are depicted in FIG. 2. The other circuitry 106, including the type of domino circuits implemented therein, can be the same or different from that of the circuitry 104.

Referring to the contents of the circuit 104, the driver 116 is coupled to provide the clock signal CK to a precharge device 118. For example, the precharge device 118 is illustrated as a PFET (p-type Metal Oxide Semiconductor Field Effect Transistor (MOSFET)) that is coupled between $V_{DD}$ and a precharge node 120. The precharge node 120 is coupled to an output 122 through an inverter 124. Additionally, the precharge node 120 is coupled to an associated logic block 126. Those skilled in the art will appreciate that any type of logic circuitry can be implemented as logic block 126 (e.g., AND/NAND functions, OR/NOR functions, exclusive OR/NOR functions or combinations thereof). Thus, one or more input signals 128 can be provided as inputs to the logic block 126. The logic implemented by the logic block 126 thus can be evaluated for the one or more input signals 128, such as when the node 120 is high.

For purposes of illustration, the domino logic circuitry 104 is illustrated with an optional NFET (n-type MOSFET) M2 coupled between the logic block 126 and ground. The transistor M2 also is controlled by an output signal from the driver 116. The control signal to M2 can be the same clock signal CK provided to transistor M1 or, alternatively, there could be different clock signals.

In order to maintain the charge at the precharge node 120, the circuitry 104 also can include an associated keeper 130. In this example, the keeper 130 includes a PFET M3 coupled between the precharge node 120 and $V_{DD}$ and having its gate coupled to the output 122. An optional NFET M4 also is coupled between the precharge node 120 and ground, with its gate also coupled to the output 122. The keeper 130 operates as latch by helping to maintain the voltage at the precharge node 120 based on the output 122. Thus, the logic function of the logic block 126 can be evaluated based on the clock signal CK by causing the precharge node to change states monotonically based on the inputs to the logic block. The keeper 130 operates to maintain the dynamically stored value or state at the precharge node 120 based on the output 122. Thus, if the output 122 is low, the precharge node 120 will be maintained in a high condition, as M3 will couple the node to $V_{DD}$. Conversely, if the output at 122 is high, M4 will couple the precharge node 120 to ground to hold a low state. The sizing of the keeper devices introduces a balance between impacting the speed of the gate and improving the immunity to leakage and noise induced failures. For example, a larger keeper provides better noise and leakage immunity but impacts speed more significantly. Those skilled in the art will appreciate various other types of keeper arrangements that can be utilized to help maintain a desired voltage at the node 120.

According to an aspect of the present invention, the precharge device 118 operates as a supplemental keeper during bum-in. In particular, the precharge device 118 partially conducts current to the precharge node 120 during bum-in based on the clock signal CK being provided at the intermediate level for the predetermined duration. As a result, the precharge device 118 can source current to the precharge node 120 so as to improve noise and leakage immunity at the precharge node. This helps noise events settle out of the precharge node 120 during bum-in. The other circuitry 106 driven by the clock signal CK includes similar precharge device(s) that can also operate as supplemental keepers during bum-in to reduce associated noise.

By modifying the clock signal temporarily, such as to a reduced level during a noise reduction mode (e.g., during bum-in), keeper designs for the associated circuits 104–106 can be minimized in accordance with an aspect of the present invention. That is, because the clock signal is modified to enable existing components to precharge the node 120 during bum-in, extra components are not required in the associated circuitry 104–106 as might otherwise be required to enhance the functionality of the keeper 130.

Additionally, the precharge devices in the circuitry 104–106 are biased at an intermediate level during the noise reduction mode, which level can vary based on relative characteristics of components (e.g., PFET and NFET devices) implemented in the driver 116. For example, the intermediate level of the clock signal CK during in the noise reduction mode varies based on the relative strengths of output PFET and NFET devices in the driver 116. During bum-in, these driver devices cooperate with components of the control system 112 to provide the clock signal CK. The differences in the relative strengths of these devices, which are due to process variations, will be substantially similar to process variations in the associated circuitry 104–106. In particular, because the associated circuits 104–106 are in a relatively close proximity to the clock generator 102 in the IC 100, the intermediate level of the output signal is self-biasing to mitigate the effects of process variations in the respective circuits 104–106.

Additionally, by implementing such a waveform controller in multiple clock generators (or clock gaters) distributed across a VLSI chip, such as a microprocessor, bum-in can be facilitated across the entire chip. Further, because each such switch system can be implemented in a respective clock generator that controls a plurality of associated circuitry 104–106 (e.g., typically on the order of 100–1,000 circuits), a minimal amount of die area is required, which further facilitates greater device densities. That is, the present invention facilitates a reduction in the size of keeper circuits, while maintaining or improving performance of such circuitry during bum-in. This is to be contrasted with conventional approaches in which each associated circuit would implement its own large associated keeper to help maintain the charge at the precharge node thereof during bum-in.

Figure 3:
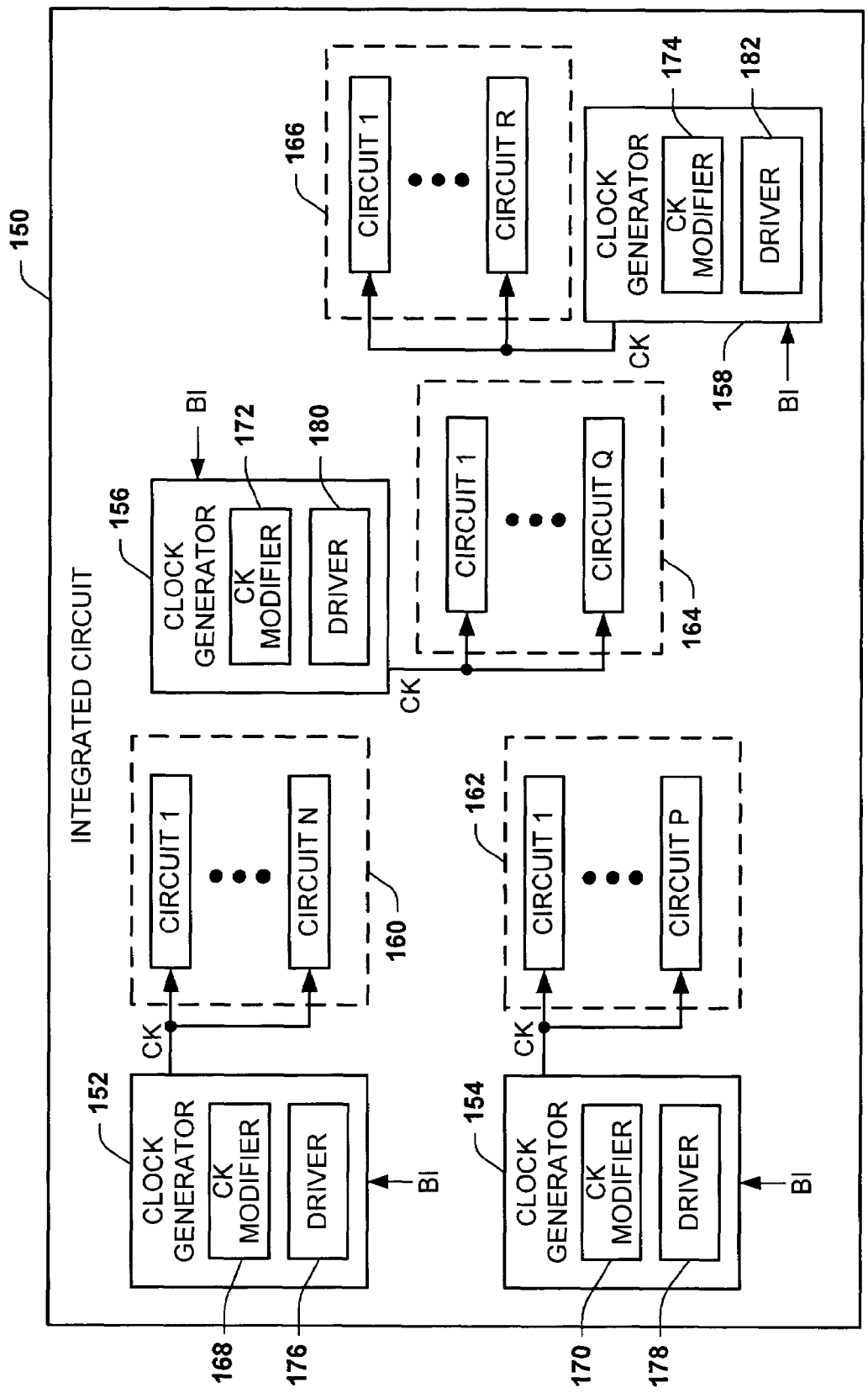
FIG. 3 depicts an example integrated circuit chip that includes plural clock generators distributed across the chip in accordance with an embodiment of the present invention.

FIG. 3 is an example of an integrated circuit chip 150 that includes a plurality of clock-generator system 152, 154, 156 and 158 distributed across the chip 150. Each clock generator 152–158 is coupled to drive a set of associated circuits 160, 162, 164 and 166 according to respective clock signals generated thereby. Those skilled in the art will appreciate that any number of one or more (e.g., typically on the order of hundreds or thousands) such circuits can be associated with each clock generator 152–158. Each circuit, for example, is a dynamic circuit, such a domino logic circuit configured to enable evaluation of associated logic circuitry (not shown).

Each clock generator 152–158 includes a clock modifier 168, 170, 172 and 174. The clock modifiers 168–174 are associated with respective drivers 176, 178, 180 and 182 for controlling a clock output signal provided to the associated circuitry 160–166. The particular design and configuration of the drivers 176–182 will vary according to the number and type of associated circuits 160–166 being driven thereby. In a normal operating mode, the drivers 176–182 provide a normal clock signal that alternates between high and low signals at a desired frequency and duty cycle. During bum-in, the clock modifiers 168–174 control the respective drivers 176–182 to provide the clock signals CK at an intermediate level for a predetermined duration. After the providing the clock signal at the intermediate level for the predetermined duration, the clock signal can be provided at its high (or low) level as normally would be provided. The bum-in process can be implemented based on a bum-in enable signal BI, which can be provided to each of the clock generators 152–158, as depicted in FIG. 3.

The respective clock modifiers 168–174, while illustrated schematically in FIG. 3, can be implemented in any manner shown and described herein to provide a clock having an intermediate level (e.g., a voltage shelf) between the normal high and low levels of the clock signal. Additionally, the intermediate level of each respective clock signal CK implemented during bum-in can be fixed or it can be self-biasing according to an aspect of the present invention. As described herein, a self-biasing intermediate level can vary according to local process variations associated with each respective clock generator, such as those associated with the driver. Because the circuits 160–166 are implemented in close proximity to an associated clock generator 152–158, employing a self-biasing intermediate clock level during bum-in, according to an aspect of the present invention, can mitigate similar process variations in such circuits.

By way of further example, a fixed intermediate level can be provided by coupling the clock output to a suitable voltage supply for a predetermined duration during a bum-in condition. Those skilled in the art will understand and appreciate various arrangements that could be utilized to implement such a fixed or self-biasing voltage (e.g., voltage dividers in an arrangement of transistors or resistors), all of which are contemplated as falling within the scope of the appended claims.

Figure 4:
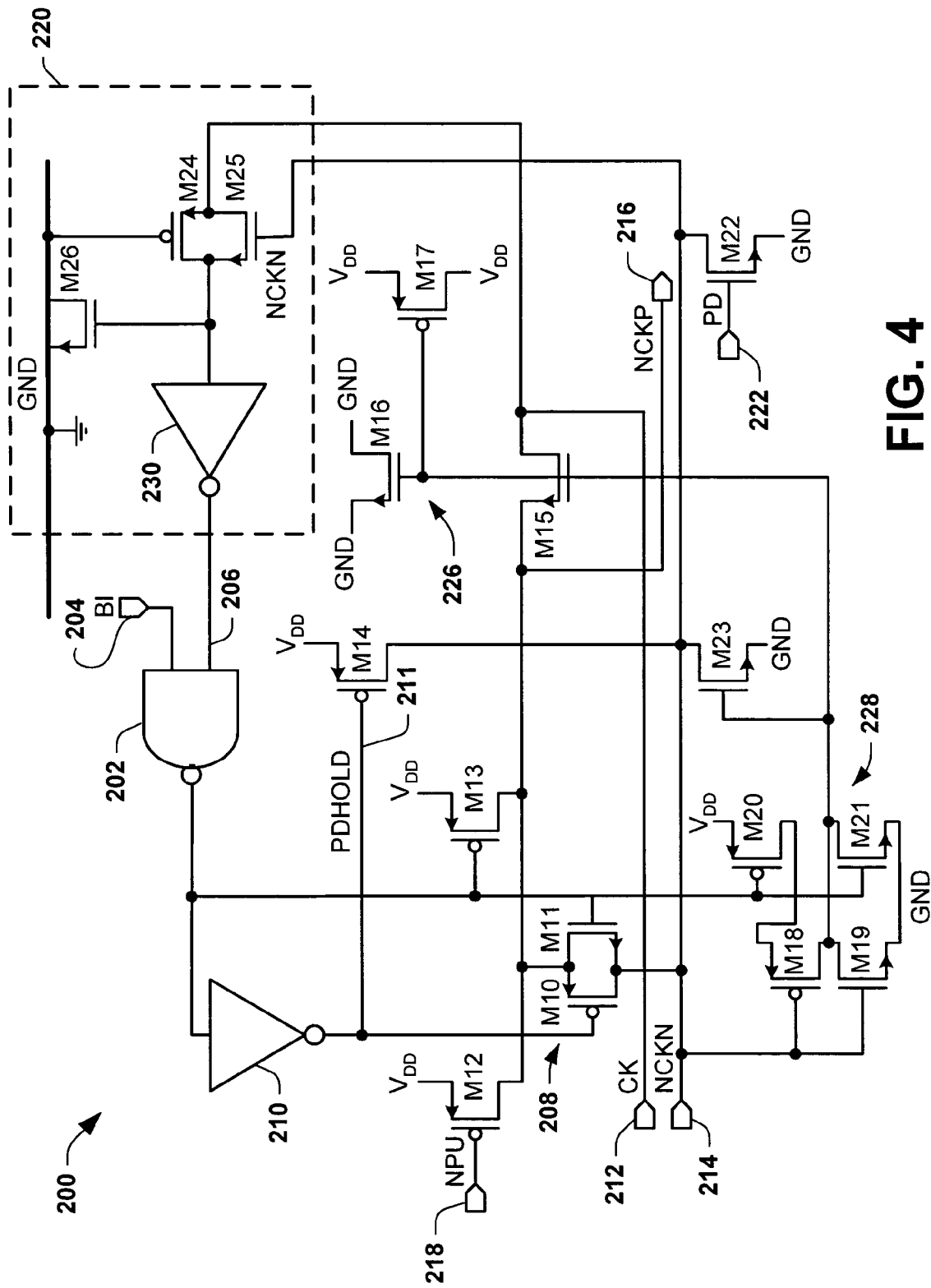
FIG. 4 depicts an example circuit diagram of a system that can be utilized to provide a temporary reduced output in accordance with an embodiment of the present invention.

FIG. 4 illustrates a circuit diagram for an example waveform control system 200 that can be utilized to gate one or more associated dynamic circuits according to an aspect of the present invention. The system 200 includes a NAND gate 202 that receives a bum-in enable signal, indicated at BI, at a first input 204 and another signal at input 206. The signal at 206 corresponds to a delay signal. The NAND gate 202 is coupled to provide an output to control a pass gate 208 that includes transistors M10 and M11. In particular, the output is coupled to the gate of M11, as well as to the gate of M10 through an inverter 210. The output of the inverter 210 corresponds to a PDHOLD signal provided at 211. The PDHOLD signal can be provided as feedback to an associated predriver (not shown).

The system 200 receives a clock (CK) signal at node 212, which the system further can modify based on the operating mode of the system. The system 200 also utilizes a gate control signal NCKN at node 214. The clock signal CK and the NCKN signal, for example, are provided from an associated predriver (see, e.g., FIG. 7). The system 200 generates another gate control signal NCKP at 216. During a normal operating mode, the nodes 214 and 216 are shorted through the pass gate 208, such that NCKN and NCKP are essentially the same signal. NCKN and NCKP are operative to gate respective NFET and PFET devices of an associated driver (see, e.g., FIG. 8) to which the system 200 can be coupled. As mentioned above, the driver thus provides the output clock signal CK at a level based on NCKN and NCKP. During a noise reduction mode, such as implemented during bum-in, the system 200 provides NCKN and NCKP to enable a precharge device of associated circuitry to operate as a supplemental keeper according to an aspect of the present invention.

NCKP at 216 is coupled to a common drain of transistors M12 and M13. Transistors M12 and M13 operate as pull up transistors for NCKP at 216. In particular, M13 is coupled to the output of the NAND gate 202 to pull up NCKP at 216 when the output of the NAND gate is low. Another input 218 provides an input signal NPU to the gate of M12 also for driving NCKP high. NPU, for example, is provided by the predriver (not shown). The output of the inverter 210 also is coupled to gate a PMOS transistor M14, which is coupled to pull up the NCKN signal at 214 to $V_{DD}$ based on the inverted output of the NAND gate 202, namely PDHOLD.

NCKN at 214 also is coupled to a delay network 220. The delay network 220 is configured to implement a delay based on the clock signal CK provided at 212 and NCKN. As mentioned above, NCKN goes low at burn-in in response to the output of the inverter 210 going high and thus disconnects NCKN from $V_{DD}$. The delay network 220 provides a corresponding delayed signal to the input 206 of the NAND gate 202. The delay network 220 is configured to provide a desired amount of delay, such as a few clock cycles, sufficient to allow noise events to settle in the associated circuitry being driven by the clock signal CK during bum-in. Thus, the amount of delay can be configured according to the application and the associated circuitry in connection with which the system 200 is to be utilized. Typically, the amount of delay will be set at design time, although those skilled in the will appreciate that additional means can be implemented to enable the duration of the delay to be variable.

Another NFET transistor M15 is coupled between 216 associated with NCKP and 212 associated with the output clock signal CK. A gate of M15 is coupled to receive a control signal based on NCKN and the output of the NAND gate 202. As mentioned above, the output of the NAND gate corresponds to feedback that can be provided to the associated predriver. Thus, when the control signal is high, M15 operates to couple nodes 212 and 216. The transistor M15 also is coupled to a transistor network 226 that includes M16 and M17 to provide desired capacitance at the gate of M15. The capacitance at the gate of M15 facilitates biasing M15 during bum-in.

By way of example, a logic network 228 provides the gate control signal to gate M15 based on the feedback signal provided by the NAND gate 202 and NCKN, which is provided by the associated predriver (not shown). In particular, the logic network includes transistors M18, M19, M20 and M21 that are arranged to operate as a NOR gate based on NCKN and the output of the NAND gate 202. That is, the network 228 drives gate of M15 high when both NCKN and the output of the NAND gate are low. The network 228 helps mitigate erroneously activating M15 if the noise reduction mode is not properly qualified.

Additionally, a PD signal is provided (e.g., by the associated predriver) to a transistor M22, which is coupled between 214 and ground. Thus, when PD goes high, it pulls NCKN low. Thus, PD facilitates timing associated with pulling NCKN low during a noise reduction mode to ensure proper activation of M15. Another transistor M23 also is coupled between NCKN and ground. The gate of M23 receives the output of the logic network 228 to facilitate holding NCKN low during the noise reduction mode (while PDHOLD is high).

In one example implementation, NCKP at 216 is coupled to the gate of an output PFET. Thus, activation of M15 (e.g., in response to both NCKN and the feedback signal going low) results in a diode connection of the output PFET. Accordingly, when M15 is activated during the noise reduction mode, the diode connection of the output PFET causes the clock signal CK to be provided at an intermediate level for a predetermined duration. Additionally, during the bum-in process, an output NFET of the driver connected at 214 also is biased partially on during the bum-in condition, namely according to voltage at NCKN, such as can be provided by the associated predriver.

According to an aspect of the present invention, the intermediate level of the clock signal during bum-in varies according to the relative strengths of output PFET and NFET devices of the driver (see, e.g., M52 and M53 in FIG. 8), which are coupled to provide the clock signal CK at 212. For example, during the diode connection, there is a voltage drop across the output PFET during its diode connection, such as from $V_{DD}$ to the clock signal CK at 212. Additionally, there is an active pull down to ground from the clock signal CK output at 212 to ground through associated components of the clock system that includes the gater system 200. In the example of FIG. 4, the pull down to ground includes M15, the pass gate 208 (M10 and M11), as well as other components in the associated predriver (see, e.g., M50 and M51 in FIG. 7) that are in parallel with M22. This configuration operates as an active voltage divider formed by the connected components between $V_{DD}$ and ground. It will be appreciated that such an arrangement provides the intermediate level of the clock signal CK as self-biasing intermediate level in accordance with an aspect of the present invention.

By way of further example, the system 200 can provide a value for the intermediate level of the clock signal CK at 212 that tracks local process variations in the integrated circuit implementing such system. For example, when NFETs (including the output NFET in the driver) in the IC are relatively stronger than PFETs (including the output PFET of the driver), the intermediate level of the clock signal will be lower. This enables the precharge device in associated dynamic circuitry to precharge a precharge node harder (acting as a stronger supplemental keeper), which is appropriate since faster NFETs are more noise susceptible and the precharge PFET is relatively weaker. In contrast, when PFETs are relatively stronger than NFETs, the intermediate level of the clock signal will be higher. Thus, when the PFETs are stronger than the NFETs, the PFETs (being stronger) do not require as large a bias to provide the desired noise immunity function in the associated circuitry. Thus, the supplemental keeper is self-biasing according to local process variations, which enables improved performance and precision operation.

The duration that CK is provided at the intermediate level is commensurate with the duration that the gate of M15 is held high, which corresponds to NCKN and the output of the NAND gate 202 both being low. This duration is based on the length of delay implemented by the delay network 220, which controls PDHOLD at 211 and PD at 222. For example, during the noise reduction mode, the network 228 holds the gate of M15 high until the delay 220 triggers the NAND gate 202 to go high. This also causes the PDHOLD signal at 211 to go low, which results in activating M14 to pull NCKN high. Contemporaneously, PDHOLD is fed back to an associated predriver (or other circuitry) that generates PD as a function of PDHOLD. Thus, when PDHOLD goes low, the PD signal at 222 also is driven low, thereby deactivating the transistor M22 to remove the associated pull down of NCKN to ground. Thus, when the output of the NAND gate 202 goes high, the gate of M15 is driven low through activation of M21 and/or M19. This disconnects 212 and 216, which removes the corresponding diode connection of the output PFET. Additionally, when the network 228 output goes low, M23 goes off to remove the associated pull down of NCKN to ground. This, in turn, leads to normal operation of the system 200 in which the pass gate 208 re-connects 214 and 216 so that the clock signal CK can transition between its normal high and low levels according to the clock frequency.

In the example of FIG. 4, the delay network 220 includes a pass gate formed of transistors M24 and M25 that couple the clock signal CK at 212 to an input of an inverter 230. A transistor M26 is also coupled at the input of the inverter 230 to provide a desired level of capacitance for controlling the rate at which the voltage at such input transitions (dv/dt characteristics). The output of the inverter 230 feeds the delayed signal to the input 206 of the NAND gate 202. Thus, the trip point of the inverter 230, based on the configuration of the overall network 220, will determine the duration of the intermediate level or shelf voltage for the clock signal CK. Those skilled in the art will understand and appreciate other types or circuit arrangements that could be utilized to provide a desired delay to maintain the intermediate level of the output signal for a desired period of time.

After the inverter 230 trips during a burn-in condition (e.g., BI is high), the output of the NAND gate 202 changes states from low to high, which causes PDHOLD to go low.

The predriver (or other circuitry) drives PD low based on PDHOLD going low. In response to causing PD to go from high to low during burn-in, the transistor M15 turns off, thereby removing the diode connection from the output PFET coupled at 216. Additionally, the pass gate 208 is reactivated to double 214 and 216, thereby shorting NCKN and NCKP, respectively. Substantially concurrently with PD going low, NCKN is driven low by the associated predriver (or other circuitry) and NCKN and NCKP are shorted via the pass gate 208. Accordingly, the output of the associated driver between the output PFET and output NFET is driven high (e.g., to $V_{DD}$) as NCKP is driven low.

FIGS. 5 and 6 are graphs depicting signals that can be generated by the switching network (e.g., shown and described in FIG. 4) and by a driver (e.g., shown and described in FIG. 8) biased based on such signals. In FIG. 5, a burn-in enable signal is indicated at 250. As depicted in FIG. 5, the burn-in enable signal 250 remains low until time T3 in which the signal goes high. A corresponding clock signal 252 is depicted for normal operation, which goes high at T1 and goes low at T2. That is, the clock signal 252 transitions between its normal high and low levels (up to T3) according to its set clock frequency and duty cycle.

When the burn-in enable signal 250 is high (after T3), the driver provides the clock signal 252 at an intermediate level between its high and low levels for a predetermined duration, indicated from T4 to T5. In particular, while the burn-in enable signal 250 is high, the clock signal 252 rises from its low level (e.g., zero volts) to its intermediate level, corresponding to a voltage shelf 254. After T5, the clock signal 252 rises from the voltage shelf 254 to its high level where it remains until T6. It is to be appreciated that the duration of the modified pulse from T4 through T6 is substantially identical to the pulse duration during normal operation, namely from T1 to T2.

The clock signal 252 depicted in FIG. 5 can be generated based on control input signals provided to the driver, such as NCKN and NCKP signals, which are depicted in FIG. 6. For purposes of comparison, the ordinate axis in the graph of FIG. 6 includes the same timing references T1–T6, as utilized in FIG. 5.

FIG. 6 depicts control signals 260 and 262 that can be provided to an associated driver to generate the output clock waveform 252 depicted in FIG. 5 in accordance with an aspect of the present invention. As mentioned above, during normal operation, NCKN and NCKP are shorted together, such as through a PASS gate (208 in FIG. 3). Accordingly, the signals 260 and 262 are substantially identical up to about T4. At about T4, when the clock pulse 252 begins its transition from low to high and the burn-in enable signal 250 is high, the signals 260 and 262 are driven to respective intermediate levels indicated at V1 and V2. For example, the signal 262 can be generated by diode connecting an associating output PFET of the driver. The signal 260 also is driven at a reduced level, such that the clock signal 252 (FIG. 5) is driven at a corresponding intermediate level based on the relative strengths of the components being driven by signals 260 and 262.

NCKN and NCKP are driven at the reduced level for a predetermined duration controlled by a delay implemented by associated circuitry. After the duration, near T5, the signals 260 and 262 are again shorted together and thus return to their low level for the remainder of their associated clock cycle. This results in the clock signal being driven high. Such intermediate levels can be repeatedly implemented during a burn-in process according to an aspect of the present invention. In this way, one or more associated precharge devices driven during burn-in clock signal 252 can partially conduct current to an associated precharge node to improve noise immunity and mitigate leakage at the precharge node. This results in improved operation of the dynamic circuitry to facilitate burn-in according to an aspect of the present invention.

Figure 7:
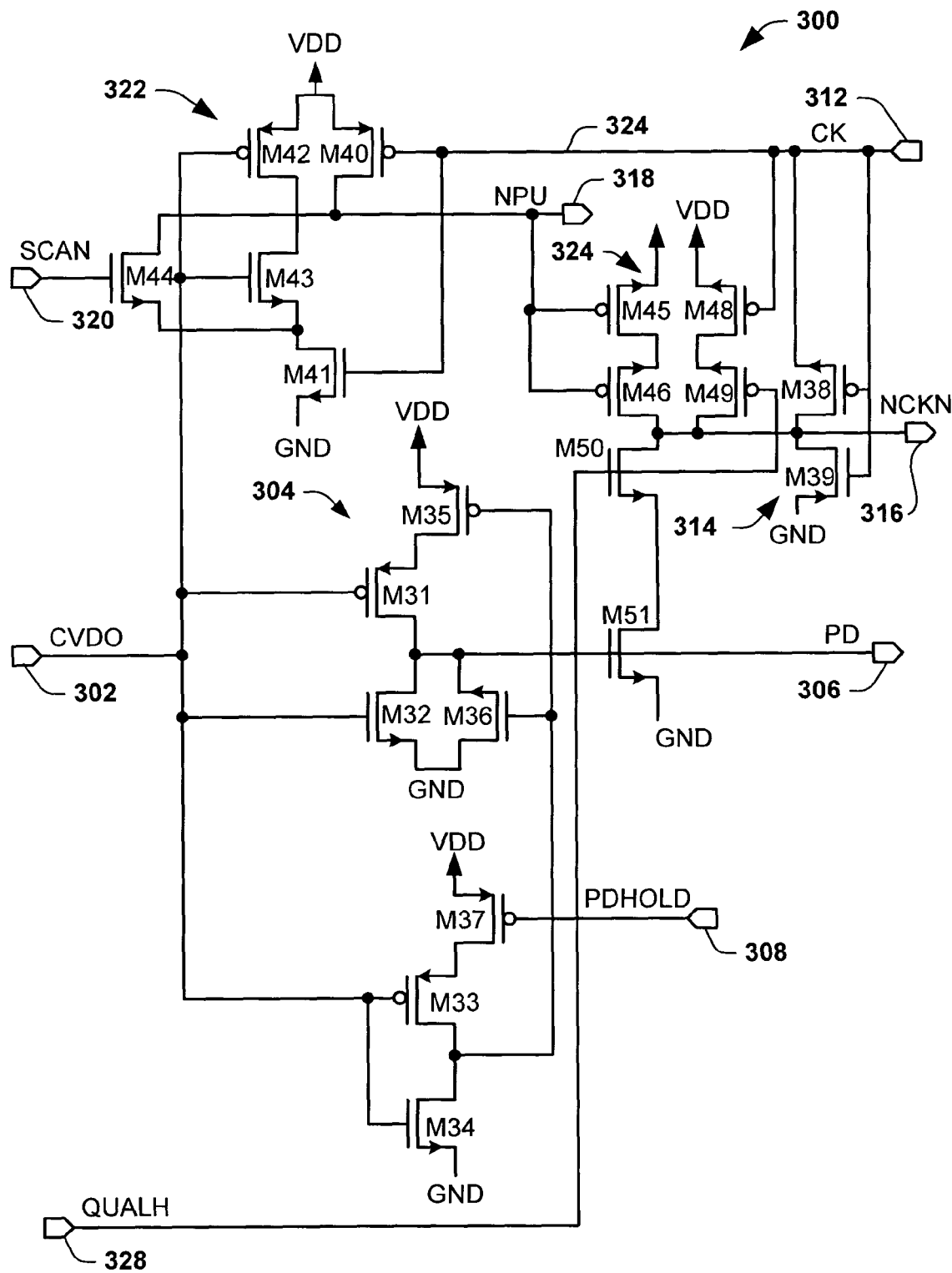
FIG. 7 depicts an example of a predriver circuit that can be utilized in accordance with an embodiment of the present invention.

FIG. 7 illustrates an example of a predriver circuit 300 that can be implemented in a clock generation system in accordance with an aspect of the present invention. The circuit 300 receives an oscillator signal (CVDO) at 302 that is provided to a burn-in control network 304. The burn-in control network 304 generates a PD output signal at 306 based on CVDO and a PDHOLD signal received at 308. For example, the CVDO signal is provided to gates of transistors M31, M32, M33 and M34. M31 and M32 are complementary transistors having a common drain corresponding to the PD signal at 306. Thus, one of M31 and M32 couples the output 306 to its respective source depending on the state of CVDO at 302. The source of M31 is coupled to the drain of transistor M35, which is coupled between M31 and $V_{DD}$. Thus if CVDO is high, the PD output signal at 306 is pulled low through M32. In contrast, if CVDO is low, the PD signal at 306 varies according to the state of the signal provided to the gate of M35. M32 has its source coupled to ground in parallel with transistor M36.

M35 and M36 have their gates coupled to a common drain of complementary transistors M33 and M34. The source of M33 is coupled to the drain of another transistor M37, which has its gate coupled to receive a PDHOLD input signal at 308. For example, the PDHOLD signal at 308 is provided from an associated waveform control system implemented in accordance with an aspect of the present invention (see, e.g., FIG. 4). PDHOLD controls the output of signal provided to the gates of M35 and M36 when CVDO is low. That is, if CVDO is low and PDHOLD at 310 is low, the gates of M35 and M36 are driven high. Initially, during burn-in, PDHOLD is high. Accordingly, when CVDO transitions from high to low, the signal at the gates of M35 and M36 will remain low until triggered by PDHOLD changing from high to low. PDHOLD thus operates to bias M36 to cause the control network 304 to hold the common drain of M33 and M34 at its present state based on the PDHOLD signal at 308.

M31, M32, M35 and M36 operate to control the PD output signal at 306. That is, during a burn-in condition, PD is held high while CVDO is low if the control input provided at the gates of M35 and M36 (e.g., the signal the common drain of M33 and M34) is also low. As a result, when CVDO goes from high to low during burn-in, the PD signal at 306 will go high since the gates of M35 and M36 are held low based on PDHOLD initially being high during burn-in. The duration at which PD is high depends on PDHOLD. In particular, PD at 306 will remain high so long as the PDHOLD signal also is high and CVDO is low.

By way of example, if PDHOLD is high while CVDO is low, the gate of M35 will be maintained at its present state (e.g., low) until either CVDO changes states or PDHOLD goes low. As mentioned above, PDHOLD goes low after implementing a desired delay at burn-in based on the clock signal CK going high, which generally occurs opposite CVDO going low. When PDHOLD goes low (after implementing the delay), the gates of M35 and M36 go high so that PD at 306 is pulled low through M36. As described with respect to the example of FIG. 4, when PD is pulled low, the diode connection of the output PFET and the associated active pull down to ground are broken, such that the corresponding clock output signal CK is driven to at its normal (e.g., high) level.

In the predriver 300, the clock signal CK is provided at 312 to feed an inverter 314 that includes transistors M38 and M39 coupled between 312 and ground. The output of the inverter 314, indicated at 316, provides an output signal NCKN. The clock signal CK provided at 312 also gates transistors M40 and M41. CVDO provided at 302 controls transistors M42 and M43 coupled between $V_{DD}$ and M41. M40 also is coupled between $V_{DD}$ and node 318. A scanning input signal SCAN is provided at 320 to a gate of transistor M44, which is coupled between the output at 318 and the drain of M41.

A logic network 322 that includes transistors M40–M44 thus is operative to control the NPU signal at 318 as a function of CVDO, SCAN and the clock signal CK. The NPU signal at 318 is provided to an associated logic network 324, which includes transistors M45, M46, M48 and M49. The network 324 thus is operative to generate the NCKN signal at 316 based on the clock signal CK, a QUALH signal provided at 328. In particular, when NPU goes low, it drives the NCKN high. QUALH also biases transistor M50. M50 and transistor M51 are coupled between the drain of M46 and ground. Thus, if QUALH and PD are high (e.g., as initially during a burn-in condition) M50 and M51 couple 316 to ground. This results in NCKN being driven at an intermediate level, for example according to the active pull down circuit formed between VDD and ground that includes M50 and M51 as well as associated devices in the waveform control system (see, e.g., FIG. 4). When PD goes low, the active pull down circuit is broken, as M51 disconnects NCKN from ground. Also, in response to PD being driven low, as mentioned above, the diode connection of the associated output PFET will be removed.

In view of the example of FIG. 7, those skilled in the art will appreciate other ways that can be utilized to implement a predriver or other circuitry to control the PD signal according to an aspect of the present invention. It will be further appreciated that the present approach facilitates use of clock generation circuitry, such that a waveform control system can be implemented as a modular extension of such clock generation circuitry. Alternatively, new clock generators can be implemented based on the teachings described herein to provide improved performance and facilitate burn-in processes in associated circuits.

Figure 8:
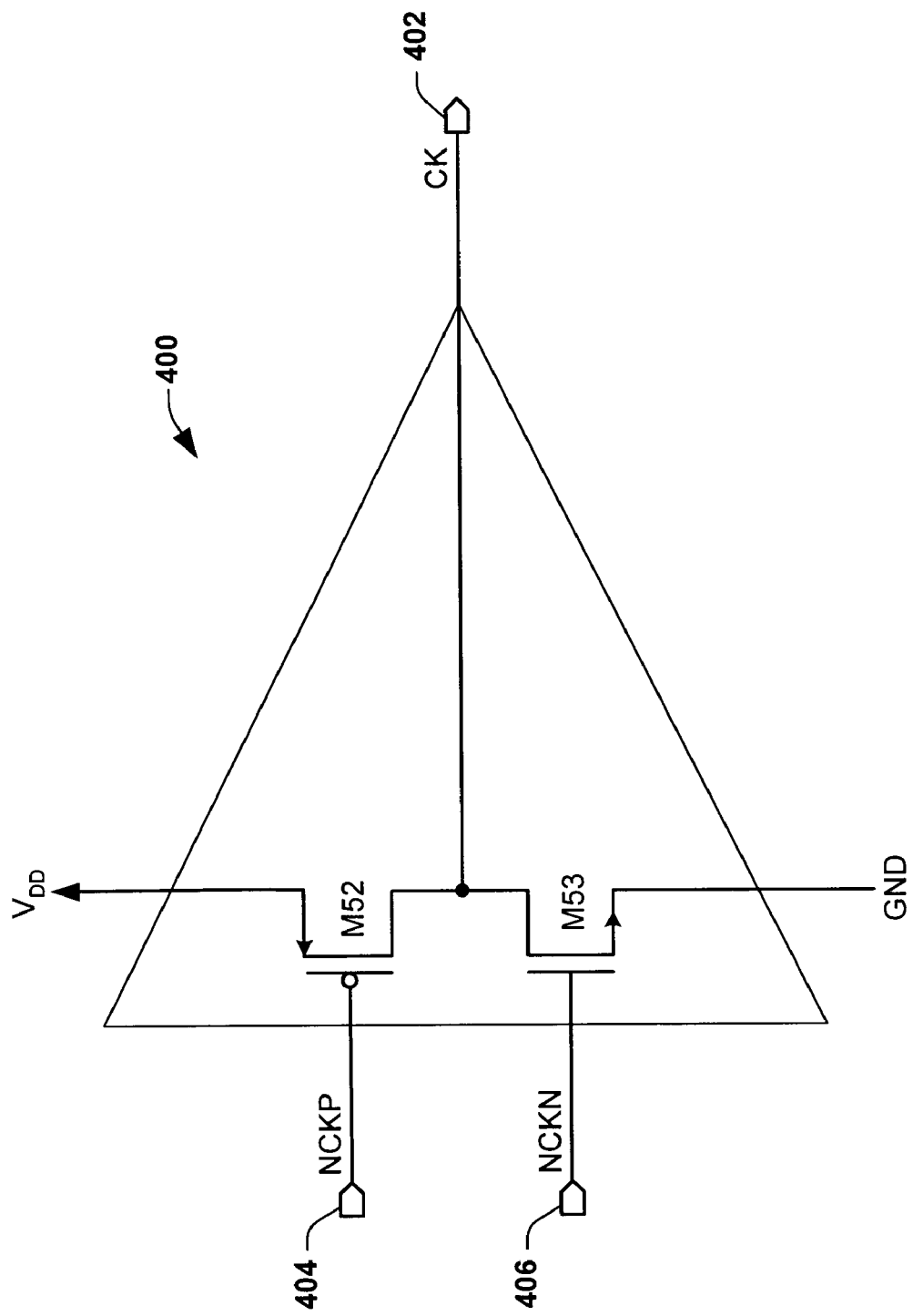
FIG. 8 is an example of a driver circuit that can be implemented in accordance with an embodiment of the present invention.

FIG. 8 depicts an example of a driver 400 that can be utilized in a clock generator according to an aspect of the present invention. The driver 400 is operative to provide a clock output signal CK based on NCKP and NCKN input signals provided at 404 and 406, respectively. For example, NCKP and NCKN are provided by a control system implemented in accordance with an aspect of the present invention (see, e.g., FIG. 4). The driver 400 includes a PFET M52 coupled in series with a NFET M53 between $V_{DD}$ and ground. The output 402 is taken at a common drain of M52 and M53.

During normal operation the driver inputs 404 and 406 are shorted together, such that the clock signal is an inverted version of NCKP and NCKN provided at 404 and 406, alternating between low (e.g., ground) and high (e.g., $V_{DD}$) levels. During burn-in, each of NCKP and NCKN are driven at a corresponding reduced level. As mentioned above, this is implemented by configuring associated circuitry to provide NCKN and NCKP at desired levels for a predetermined duration, which results in the clock output signal CK being provided at an intermediate level, such as described herein. The intermediate level of CK during burn-in further can vary as a function of the relative strengths of M52 and M53, which provides for self-biasing of the clock signal that mitigates effects of process variations. After the predetermined duration, NCKP and NCKN are again shorted together so that the clock signal resumes one of its normal high or low levels.

While the output devices M52 and M53 are depicted as single transistors, those skilled in the art will appreciate that a network of transistors can be implemented. Such a network provides a selection of different devices from which one or more desired PFETs and/or NFETS can be selected according to the particular load(s) being controlled by the driver 400. Thus, those skilled in the art will appreciate various driver arrangements or driver configurations that can be implemented in accordance with an aspect of the present invention.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for providing a temporarily modified output, comprising:
    a waveform control that provides a control output that temporarily adjusts to an intermediate level during a transition between normal high and low levels during a first operating mode, the waveform control provides the control output to transition periodically between the high and low levels during a second operating mode;
    a delay network that controls the waveform control to provide the output at the intermediate level for a duration during the first operating mode;
    a driver that provides an output signal based on the control output provided by the waveform control, the output signal transitions between associated high and low levels during the second operating mode, and transitions to an intermediate level for the duration during the first operating mode; and
    the waveform control further comprising at least one component coupled to temporarily diode connect a transistor device of the driver, by providing each of a control input node and a second node of the transistor device with a matched voltage, to enable the driver to provide the output signal at the intermediate level for the duration of the first operating mode.

2. The system of claim 1, the waveform control further comprising a logic network that controls operation of the at least one component based at least in part on a delayed signal provided by the delay network.

3. The system of claim 1, the driver further comprising at least first and second inputs, the control output provided by the waveform control further comprising a first control output that is provided to the first input of the driver and a second control output that is provided to the second input of the driver.

4. The system of claim 3, the output signal self-biases to the intermediate level during the first operating mode based on relative characteristics of at least some devices that form the driver.

5. The system of claim 4, the devices that form the driver comprising at least one transistor of a first type associated with the first input of the driver and at least one transistor of a second type associated with the second input of the driver, the relative characteristics corresponding to the relative strengths of the at least one transistor of the first type and the at least one transistor of the second type.

6. A system for providing a temporarily modified output, comprising:
    a waveform control that provides a control output that temporarily adjusts to at intermediate level during a transition between normal high and low levels during a first operating mode, the waveform control provides the control output to transition periodically between the high and low levels during a second operating mode:
    a delay network that controls the waveform control to provide the output at the intermediate level for a duration during the first operating mode:
    a driver that provides an output signal based on the control output provided by the waveform control, the output signal transitions between associated high and low levels during the second operating mode, and transitions to an intermediate level for the duration during the first operating mode, the driver further comprising at least first and second inputs, the control output provided by the waveform control further comprising a first control output that is provided to the first input of the driver and a second control output that is provided to the second input of the driver and
    the waveform control couples the first and second inputs of the driver together except for the duration during the first operating mode, the waveform control provides the first and second control outputs to the driver at associated intermediate levels between respective normal high and low levels for the duration during the first operating mode.

7. The system of claim 6, the waveform control further comprising circuitry coupled to temporarily diode connect a device of the driver such that at least a portion of the circuitry of the waveform control and the driver component cooperate to define a circuit arrangement that causes the driver to provide the output signal at the intermediate level for the duration of the first operating mode.

8. The system of claim 1, further comprising a precharge device that charges an associated node based on the output signal provided by the driver, the precharge device partially conducts based on the intermediate level of the output signal during the first operating mode, thereby operating as a supplemental keeper to precharge the associated node.

9. The system of claim 8, the output signal biases the precharge device at the intermediate level, which self biases according to a relative strength of at least some devices that form the driver, the relative strength of the at least some devices being related to process variations in the devices in the driver.

10. An integrated circuit chip comprising:
    a clock generator of the integrated circuit chip comprising:
        a waveform control that provides a control output that temporarily adjusts to an intermediate level during a transition between normal high and low levels during a first operating mode, the waveform control provides the control output to transition periodically between the high and low levels during a second operating mode;
        a delay network that controls the waveform control to provide the control output at the intermediate level for a duration during the first operating mode;
        a predriver coupled to control the waveform control; and a driver that provides an output clock signal based on the control output;

at least one associated circuit of the integrated circuit chip driven by the output clock signal provided by the driver of the clock generator;

each of the at least one associated circuits of the integrated circuit chip further comprising a precharge device that provides a charge at an associated node based on the output clock signal.

11. The integrated circuit of claim 10, each of the at least one associated circuits comprising a domino logic circuit that includes the precharge device, the first operating mode corresponds to a noise reduction mode, such that the control output at the intermediate level facilitates evaluation of the at least one circuit during the noise reduction mode.

12. A clock generator comprising:
a driver that provides an output clock signal based on at least one control signal; and
a waveform controller that provides the at least one control signal having a first waveform characteristic during a first operating mode to control the driver to provide the output clock signal having normally high and low levels, the waveform controller provides the at least one control signal having a second waveform characteristic during a second operating mode to control the driver to temporarily transition the output clock signal directly from one of the normally high and low levels to an intermediate level between the normally high and low levels and then transition the output clock signal directly from the intermediate level to the other of the normally high and low levels; and
at least one device that temporarily diode connects a transistor device of the driver, by providing a control input node and a second node of the transistor device with a matched voltage, to provide a diode-connected transistor device that enables the driver to provide the output clock signal at the intermediate level during the second operating mode.

13. The clock generator of claim 12, further comprising a network coupled to control the at least one device to implement the temporary diode connection based at least in part on a feedback signal that varies according to a delay implemented by the waveform controller.

14. The clack generator of claim 12, the driver further comprising at least first and second inputs, the at least one control signal provided by the waveform controller further comprising a first control signal that is provided to the first input of the driver and a second control signal that is provided to the second input of the driver, the first and second control signals having substantially identical waveforms during the first operating mode so tat the output clock signal transitions between the normally high and low levels, the waveform controller provides the first and second control signals to the driver as waveforms having respective intermediate levels so that the driver temporarily provides the output clock signal at the intermediate level during the second operating mode.

15. The clock generator of claim 14, the driver further comprising at least one transistor of a first type associated with the first input of the driver and at least one transistor of a second type associated with the second input of the driver, the relative characteristics corresponding to the relative strengths of the at least one transistor of the first type and the at least one transistor of the second type.

16. The clock generator of claim 12, the waveform controller further comprising circuitry and the driver further comprising circuitry, at least a portion of the waveform controller circuitry cooperating with at least a portion of the driver circuitry to form a voltage divider during the second operating mode in which a node of the voltage divider provides the output clock signal at the intermediate level during the second operating mode.

17. The clock generator of claim 16, the diode-connected transistor device of the driver forms part of the voltage divider.

18. The clock generator of claim 12, the output clock signal self-biases to the intermediate level during the second operating mode based on relative characteristics of at least some components that form the driver.

19. The clock generator of claim 12, further comprising a delay network associated with the waveform controller to control a duration for which the output clock signal is at the intermediate level during the second operating mode.

20. A clock generator comprising:
a driver that provides an output clock signal based on at least one control signal;
a waveform controller that provides the at least one control signal having a first waveform characteristic during a first operating mode to control the driver to provide the output clock signal having normally high and low levels, the waveform controller provides the at least one control signal having a second waveform characteristic during a second operating mode to control the driver to temporarily transition the output clock signal from one of the normally high and low levels to an intermediate level between the normally high and low levels and then transition the output clock signal from the intermediate level to the other of the normally high and low levels; and
a precharge device that charges an associated node based on the output clock signal provided by the driver, the precharge device partially conducts according to the intermediate level of the output clock signal during the second operating mode, thereby operating as a supplemental keeper to precharge the associated node during the second operating mode.

21. An integrated circuit chip comprising:
the clock generator of claim 12, and
at least one circuit driven by the output clock signal from the driver of the clock generator.

22. The integrated circuit chip of claim 21, the at least one circuit further comprising a precharge device that provides a charge at an associated node based on the output clock signal, the second operating mode corresponds to a noise reduction mode in which the precharge device partially conducts in response to the driver providing the output clock signal at the intermediate level, whereby evaluation of the at least one circuit during the noise reduction mode is facilitated.

23. A system for providing a temporary reduced output, comprising:
means for providing a control signal that periodically transitions between normally high and low levels during a normal operating mode; and
means for, during an operating mode that is different from the normal operating mode, controlling the means for providing to temporarily modify the control signal to an intermediate level during a transition of the control signal between the normally high and low levels, the intermediate level being between the normally high and low levels during the operating mode that is different from the normal operating mode;
means for providing a clock signal for driving associated circuitry based on the control signal;

means for providing the clock signal at an intermediate level that self-biases between normal high and low levels according to process variations in the system, and means for supplying a charge to a node of associated circuitry based on the clock signal, the means for supplying provides a supplemental charge to the node for a duration that is commensurate with a duration that the clock signal is provided at the intermediate level, whereby evaluation of the associated circuitry is facilitated.

24. The system of claim 23, further comprising means for controlling a duration for which the control signal is provided at the intermediate level.

* * * * *

UNITED STATES PATENT AND TRADEMARK OFFICE
CERTIFICATE OF CORRECTION

PATENT NO. : 7,199,611 B2  
APPLICATION NO. : 10/646936  
DATED : April 3, 2007  
INVENTOR(S) : Samuel D. Naffziger et al.

It is certified that error appears in the above-identified patent and that said Letters Patent is hereby corrected as shown below:

On the title page, in field (56), under "Other Publications", in column 2, line 4, delete "377-328" and insert -- 377-378 --, therefor.

In column 1, line 11, delete "No. 0/646,935" and insert -- No. 10/646,935 --, therefor.

In column 1, line 53, delete "bum-in" and insert -- burn-in --, therefor.

In column 1, line 58, delete "bum-in" and insert -- burn-in --, therefor.

In column 3, line 20, delete "bum-in" and insert -- burn-in --, therefor.

In column 3, line 33, delete "bum-in" and insert -- burn-in --, therefor.

In column 3, line 38, delete "bum-in." and insert -- burn-in. --, therefor.

In column 3, line 38, after "during" delete "bum-in" and insert -- burn-in --, therefor.

In column 4, line 12, delete "bum-in" and insert -- burn-in --, therefor.

In column 4, line 59, delete "bum-in" and insert -- burn-in --, therefor.

In column 4, line 65, delete "bum-in" and insert -- burn-in --, therefor.

In column 5, line 17, delete "bum-in" and insert -- burn-in --, therefor.

In column 5, line 28, delete "bum-in" and insert -- burn-in --, therefor.

In column 5, line 57, delete "bum-in" and insert -- burn-in --, therefor.

In column 5, line 58, delete "bum-in" and insert -- burn-in --, therefor.

In column 5, line 61, delete "bum-in" and insert -- burn-in --, therefor.

In column 6, line 4, delete "bum-in" and insert -- burn-in --, therefor.

In column 6, line 10, delete "bum-in" and insert -- burn-in --, therefor.

In column 6, line 13, delete "bum-in" and insert -- burn-in --, therefor.

In column 6, line 16, delete "bum-in" and insert -- burn-in --, therefor.

UNITED STATES PATENT AND TRADEMARK OFFICE
CERTIFICATE OF CORRECTION

| | | |
|---|---|---|
| PATENT NO. | : 7,199,611 B2 | |
| APPLICATION NO. | : 10/646936 | |
| DATED | : April 3, 2007 | |
| INVENTOR(S) | : Samuel D. Naffziger et al. | |

It is certified that error appears in the above-identified patent and that said Letters Patent is hereby corrected as shown below:

In column 7, line 33, delete "bum-in" and insert -- burn-in --, therefor.

In column 7, line 35, delete "bum-in" and insert -- burn-in --, therefor.

In column 7, line 40, delete "bum-in" and insert -- burn-in --, therefor.

In column 7, line 43, delete "bum-in" and insert -- burn-in --, therefor.

In column 7, line 46, delete "bum-in" and insert -- burn-in --, therefor.

In column 7, line 50, delete "bum-in" and insert -- burn-in --, therefor.

In column 7, line 61, delete "bum-in" and insert -- burn-in --, therefor.

In column 8, line 6, delete "bum-in" and insert -- burn-in --, therefor.

In column 8, line 15, delete "bum-in" and insert -- burn-in --, therefor.

In column 8, line 18, delete "bum-in" and insert -- burn-in --, therefor.

In column 8, line 41, delete "bum-in" and insert -- burn-in --, therefor.

In column 8, line 47, before "process" delete "bum-in" and insert -- burn-in --, therefor.

In column 8, line 47, after "a" delete "bum-in" and insert -- burn-in --, therefor.

In column 8, line 56, delete "bum-in" and insert -- burn-in --, therefor.

In column 8, line 64, delete "bum-in" and insert -- burn-in --, therefor.

In column 9, line 1, delete "bum-in" and insert -- burn-in --, therefor.

In column 9, line 12, delete "bum-in" and insert -- burn-in --, therefor.

In column 9, line 38, delete "bum-in" and insert -- burn-in --, therefor.

In column 9, line 63, delete "bum-in" and insert -- burn-in --, therefor.

In column 10, line 15, delete "bum-in" and insert -- burn-in --, therefor.

UNITED STATES PATENT AND TRADEMARK OFFICE
CERTIFICATE OF CORRECTION

| | |
|---|---|
| PATENT NO. | : 7,199,611 B2 |
| APPLICATION NO. | : 10/646936 |
| DATED | : April 3, 2007 |
| INVENTOR(S) | : Samuel D. Naffziger et al. |

It is certified that error appears in the above-identified patent and that said Letters Patent is hereby corrected as shown below:

In column 10, lines 45-46, delete "bum-in" and insert -- burn-in --, therefor.

In column 10, line 47, delete "bum-in" and insert -- burn-in --, therefor.

In column 10, line 51, delete "bum-in" and insert -- burn-in --, therefor.

In column 11, line 65, delete "bum-in" and insert -- burn-in --, therefor.

In column 12, line 3, delete "bum-in" and insert -- burn-in --, therefor.

In column 12, line 24, delete "bum-in" and insert -- burn-in --, therefor.

In column 12, line 27, delete "bum-in" and insert -- burn-in --, therefor.

In column 12, line 50, delete "bum-in" and insert -- burn-in --, therefor.

In column 12, line 66, delete "bum-in" and insert -- burn-in --, therefor.

In column 13, line 44, delete "bum-in" and insert -- burn-in --, therefor.

In column 13, line 50, delete "bum-in" and insert -- burn-in --, therefor.

In column 13, line 58, delete "bum-in" and insert -- burn-in --, therefor.

In column 14, line 23, delete "bum-in" and insert -- burn-in --, therefor.

In column 16, line 7, in Claim 6, delete "at" and insert -- an --, therefor.

In column 16, line 11, in Claim 6, delete "mode:" and insert -- mode; --, therefor.

In column 16, line 14, in Claim 6, delete "mode:" and insert -- mode; --, therefor.

In column 16, line 25, in Claim 6, after "driver" insert -- ; --.

In column 17, line 44, in Claim 14, delete "clack" and insert -- clock --, therefor.

In column 17, line 51, in Claim 14, delete "tat" and insert -- that --, therefor.

UNITED STATES PATENT AND TRADEMARK OFFICE
CERTIFICATE OF CORRECTION

PATENT NO.         : 7,199,611 B2
APPLICATION NO.  : 10/646936
DATED              : April 3, 2007
INVENTOR(S)        : Samuel D. Naffziger et al.

It is certified that error appears in the above-identified patent and that said Letters Patent is hereby corrected as shown below:

In column 18, line 41, in Claim 21, delete "12," and insert -- 12; --, therefor.

Signed and Sealed this

Twenty-third Day of September, 2008

JON W. DUDAS
*Director of the United States Patent and Trademark Office*